United States Patent [19]

Koma et al.

[11] Patent Number: 5,039,626

[45] Date of Patent: Aug. 13, 1991

[54] METHOD FOR HETEROEPITAXIAL GROWTH OF A TWO-DIMENSIONAL MATERIAL ON A THREE-DIMENSIONAL MATERIAL

[75] Inventors: Atsushi Koma; Koichiro Saiki, both of Tokyo, Japan

[73] Assignee: University of Tokyo, Tokyo, Japan

[21] Appl. No.: 384,380

[22] Filed: Jul. 25, 1989

[30] Foreign Application Priority Data

Oct. 4, 1988 [JP] Japan ................................ 63-250716

[51] Int. Cl.$^5$ ..................... H01L 21/20; H01L 21/203
[52] U.S. Cl. ......................................... 437/81; 427/62;
437/84; 437/105; 437/108; 437/126; 437/939;
437/946; 437/976
[58] Field of Search .................... 148/DIG. 17, 24, 48,
148/56, 65, 72, 97, 110, 160, 169, 33, 33.1, 33.4;
156/610–614; 204/192.24, 192.11; 427/62, 63;
437/81, 84, 105, 107, 111, 108, 126, 133, 936,
939, 946, 945, 976

[56] References Cited

U.S. PATENT DOCUMENTS

| | | | |
|---|---|---|---|
| 4,242,419 | 12/1980 | Dayem et al. | 427/62 |
| 4,253,230 | 3/1981 | Davis | 427/62 |
| 4,865,681 | 9/1989 | Mattes | 427/62 |
| 4,892,862 | 1/1990 | Ogushi et al. | 427/62 |
| 4,912,087 | 3/1990 | Aslam et al. | 427/62 |
| 4,923,585 | 5/1990 | Krauss et al. | 204/298.04 |
| 4,931,424 | 6/1990 | Henty | 427/53.1 |
| 4,942,152 | 7/1990 | Itozaki et al. | 204/192.24 |
| 4,943,558 | 7/1990 | Soltis et al. | 427/62 |

FOREIGN PATENT DOCUMENTS 0300580 12/1988 Japan .
1033979 2/1989 Japan .
1037499 2/1989 Japan .

OTHER PUBLICATIONS

Sysoev et al., ". . . Gallium Selenide Films, Grown By the Hot Wall Method on Silicon Substrates," Phys. Stat. Sol., (a) 94, 1986, pp. K129–32.

*Primary Examiner*—Olik Chaudhuri
*Assistant Examiner*—William Bunch
*Attorney, Agent, or Firm*—Sughrue, Mion, Zinn Macpeak & Seas

[57] ABSTRACT

The disclosed method at first eliminates free bonds from a crystal surface of a three-dimensional substrate by terminating severed couplers or dangling bonds on the crystal surface by coupling such atoms to them which atoms are inseparable at temperatures for ensuring heteroepitaxial growth. The crystal surface has a 6-fold or 3-fold symmetry, such as (111) plane of a crystal of cubic symmetry or (0001) plane of a crystal of hexagonal symmetry. Then, a two-dimensional material, which is a layered material having bonds closed on a superthin two-dimensional layer, is formed by evaporation on the above dangling-bond-free crystal surface of the substrate so as to cause heteroepitaxial growth while orienting atoms of the two-dimensional material in direction of crystalline axis of the substrate by van der Vaars' force.

10 Claims, 7 Drawing Sheets

FIG_1
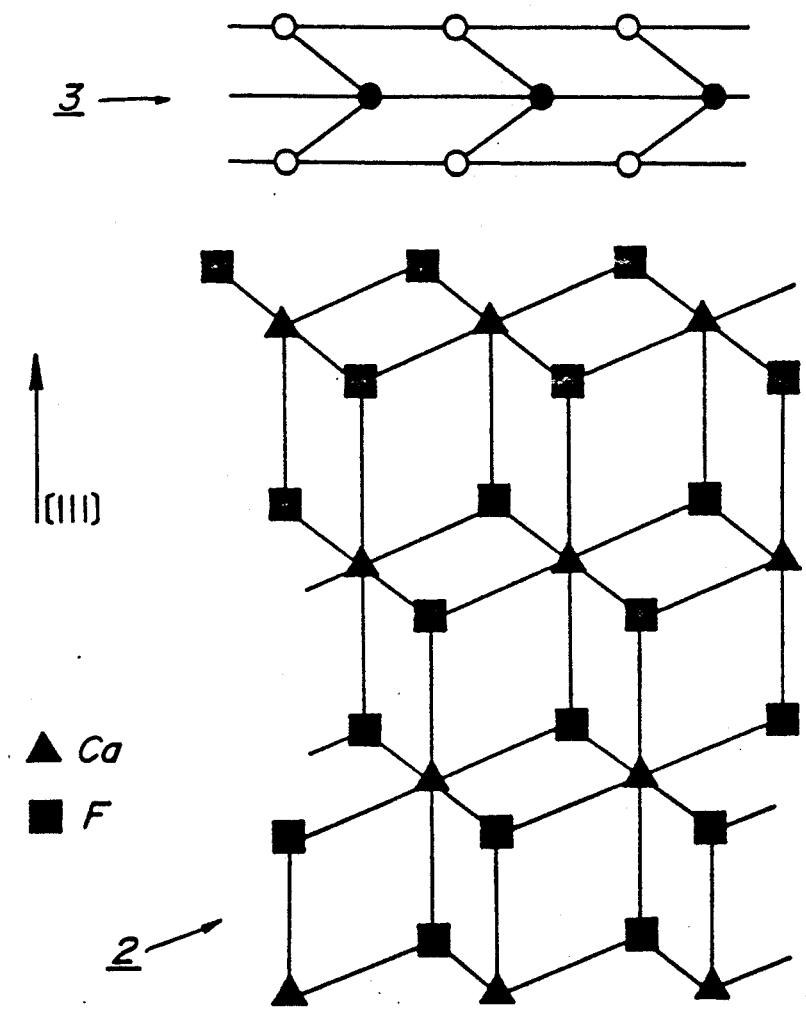

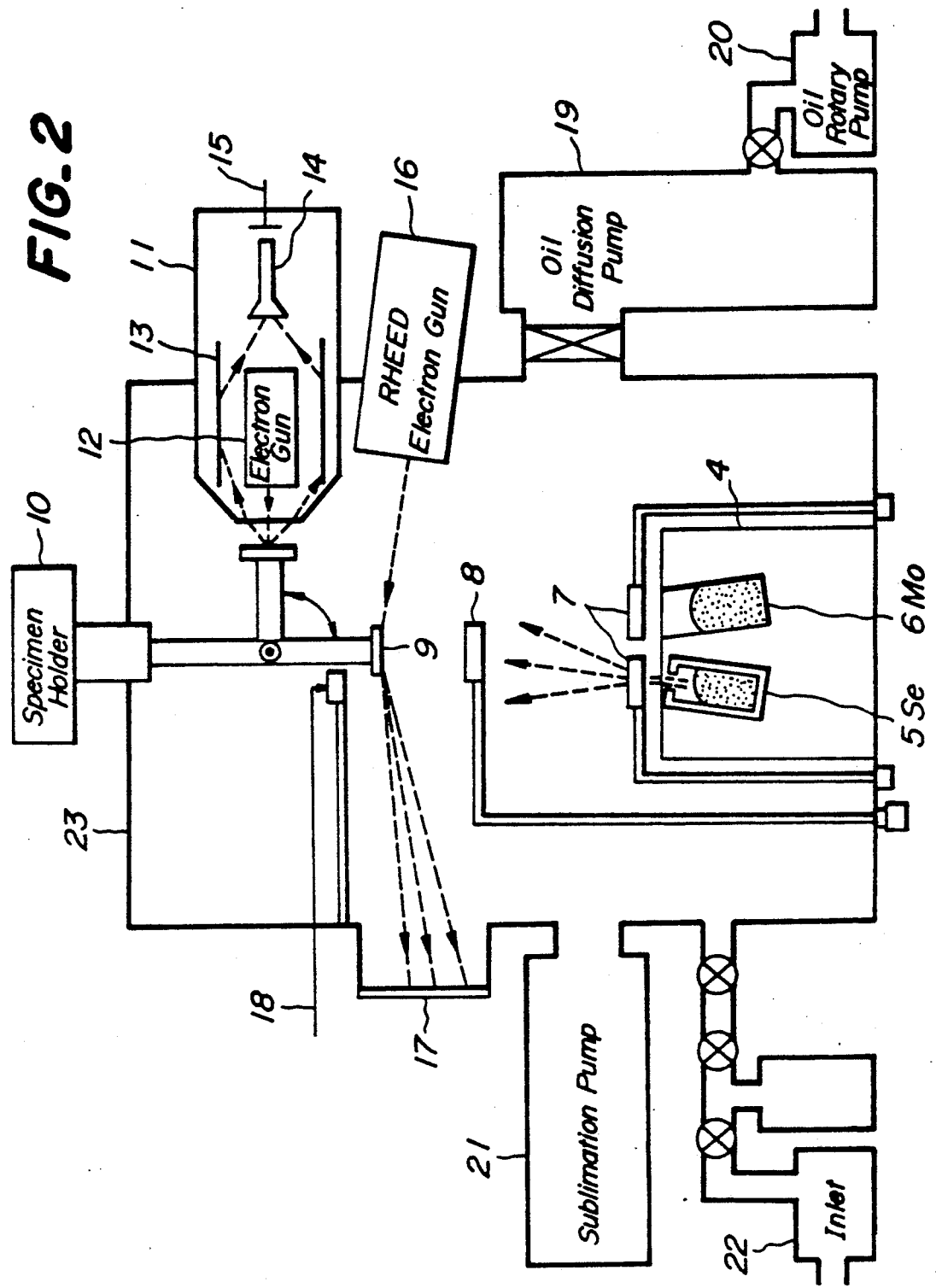

FIG_3a
CaF2
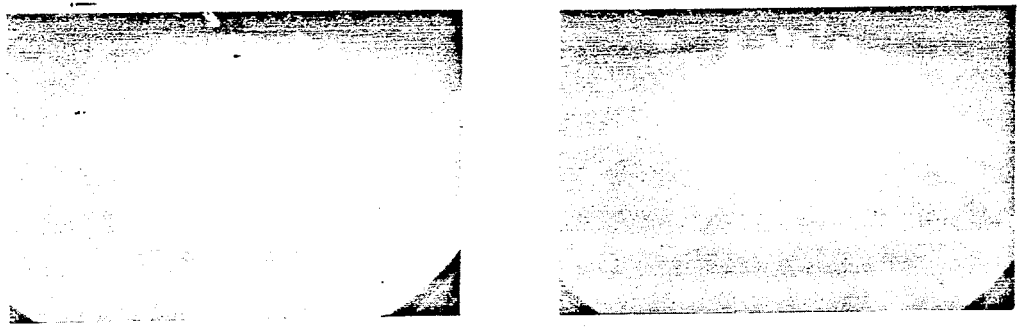
FIG_3b
MoSe2/CaF2
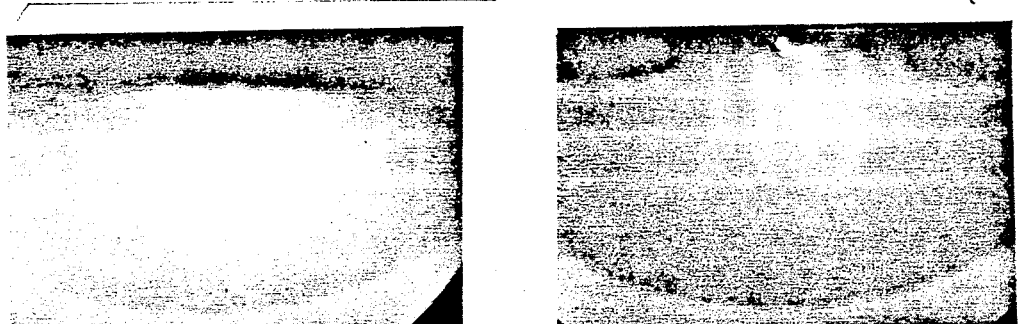

FIG._4
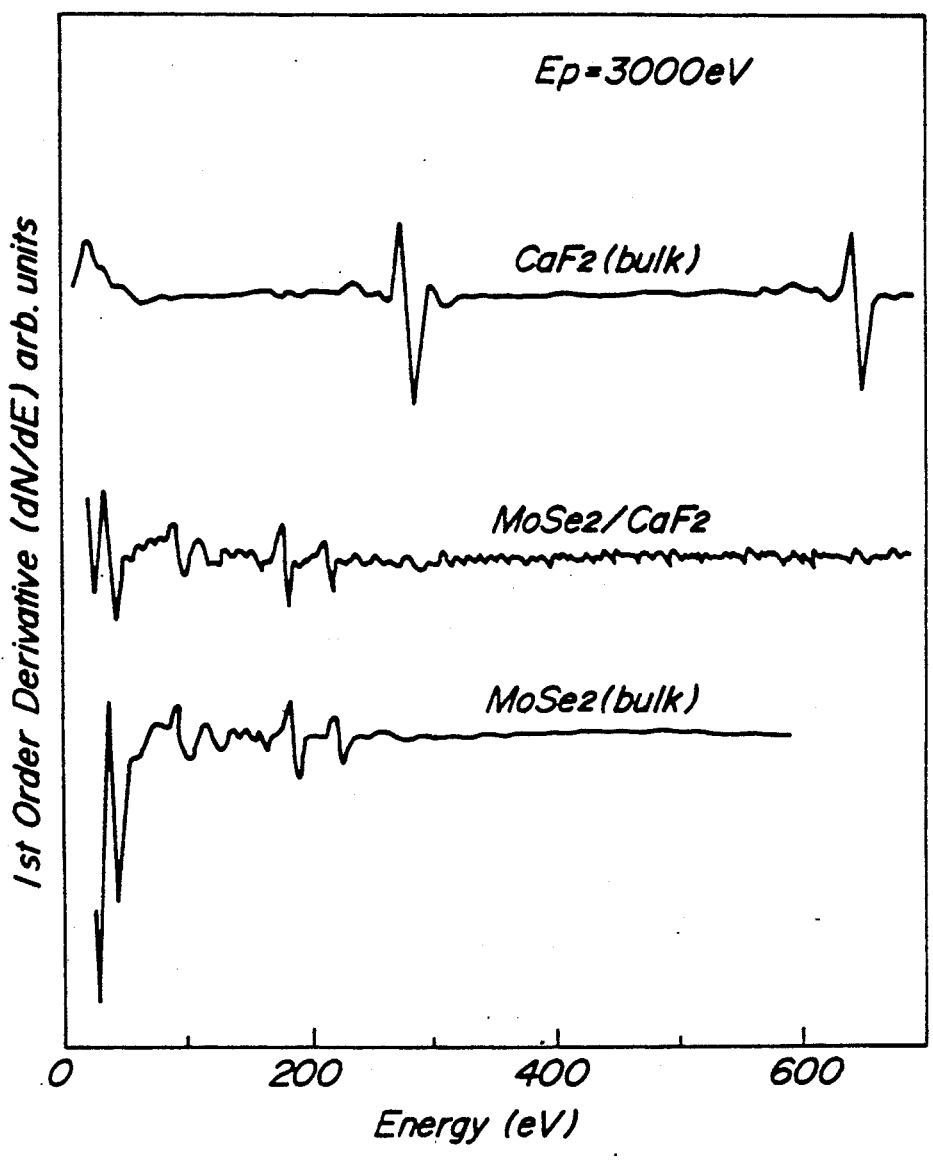

METHOD FOR HETEROEPITAXIAL GROWTH OF A TWO-DIMENSIONAL MATERIAL ON A THREE-DIMENSIONAL MATERIAL

BACKGROUND OF THE INVENTION

1. Field of the Invention

This invention relates to a method for heteroepitaxial growth of a two-dimensional material on a three-dimensional material, and more particularly the invention relates to a method of heteroepitaxial growth a two-dimensional single-crystal superthin film material, such as a layered superconductive substance, on a normal surface of a three-dimensional material such as semiconducting material. The method of the invention is very important in that it facilitates production of new electronic devices using key elements of heterojunction, such as quantum well type semiconducting laser, high-electron-mobility type transistors, heterobipolar transistors, resonant tunnel elements, superlattice elements, Josephson junction devices, and the like.

2. Description of the Prior Art

The art of forming a single-crystal superthin film of one material on the surface of a single crystal of another material is one of very important techniques, which techniques facilitate realization of new electronic devices using key elements of heterostructure, such as quantum well type semiconducting lasers, high-electron-mobility transistors, heterobipolar transistors, resonant tunnel elements, superlattice elements, and the like. In most cases, the above-mentioned formation of single-crystal superthin film relates to heteroepitaxial growth of a semiconducting material on another semiconducting material. On the other hand, examples of heteroepitaxial growth of metal, e.g., superconductive metal, or insulating material, on a semiconducting material are rather rare.

The reason for it is in that the clean surface of most solid material has severed couplers (to be referred to as "dangling bonds", hereinafter). When one tries to grow a different material thereon, unless crystal structures or lattice constants are matched, not all such dangling bonds can be coupled, and the material growing thereon cannot become a single crystal. Thus, good heteroepitaxial growth is possible only between limited number of combinations of materials, in each of such combinations the materials having similar crystal structures and satisfying lattice matching conditions.

Even if the lattice matching conditions are satisfied at a high temperature for the heteroepitaxial growth, the two materials forming the heterostructure often have different coefficients of thermal expansion, and the lattice constants of such two materials become different, so that stress is introduced between the two materials as the heterostructure is cooled to room temperature.

SUMMARY OF THE INVENTION

Therefore, an object of the present invention is to remove the restrictions in conventional processes for heteroepitaxial growth, such a lattice matching conditions, so as to expand freedom in formation of heterostructures. Most materials have three-dimensional bonds, except one-dimensional materials whose bonds are closed in one-dimensional chain and two-dimensional materials, such as layered materials, whose bonds are closed on two-dimensional layers. In the following description, materials with three-dimensional bonds will be collectively referred to as "three-dimensional materials", and materials whose bonds are closed on a two-dimensional layer will be collectively referred to as "two-dimensional materials". According to the invention, dangling bonds on the clean surface of various three-dimensional materials are somehow terminated, and heteroepitaxial growth of a two-dimensional material is effected thereon by using van der Vaars' force.

The three-dimensional materials to be used in the invention are crystalline materials having three-dimensional bonds which are formed of directional bonds such a covalent bonds and ionic bonds. Practical examples of the three-dimensional materials are as follows.

(1) Semiconducting material of IV group elements and mixed crystals thereof, such as Si, Ge, $Si_{1-x}Ge_x$, and the like.

(2) Diamond (3) Semiconducting material of III-V-compound or -mixed-crystal, such as GaAs, InP, $Ga_{1-x}Al_xAs$, $InAs_{1-x}P_x$, $In_{1-x}Ga_xAs_{1-y}P_y$, and the like.

(4) Semiconducting material of II-VI-compound or -mixed-crystal, such as ZnSe, CdS, HgTe, $Hg_{1-x}Cd_xTe$, $ZnS_{1-x}Se_x$, and the like.

(5) Alkali halides or mixed crystals thereof, such (as NaCl, KBr, $Na_{1-x}K_xCl$, $NaCl_{1-x}Br_x$, and the like.

(6) Alkaline earth halides or mixed crystals thereof, such as $CaF_2$, $SrF_2$, $BaF_2$, $Ca_{1-x}Sr_xF_2$, and the like.

(7) Silver halides or mixed crystals thereof, such as AgCl, AgBr, $AgCl_{1-x}Br_x$, and the like.

(8) Chalcopyrite type crystalline materials or mixed crystal thereof, such as $CuFeS_2$, and the like.

The two-dimensional materials to be used in the invention are crystalline materials having layered crystalline structures, which layered crystalline structures are bonded by van der Vaars' force. Practical examples of the two-dimensional materials are as follows.

(1) Dichalcogenides of transition metals or mixed crystals thereof, such as $NbSe_2$, $NbS_2$, $MoS_2$, $MoSe_2$, $HfSe_2$, $NbS_{2-x}Se_x$, and the like.

(2) Graphite (3) Such layered materials as GaS, GaSe, $GaS_{1-x}Se_x$, and the like, or mixed crystals thereof.

(4) Such layered materials as $CdI_2$, $PbI_2$, and the like, or mixed crystal thereof.

(5) Mica such as $K_2Al_4(Si_6Al_2O_{28})(OH,F)_4$, $Mg_6(Si_8O_{28})(OH)_4$, or mixed crystal thereof.

The invention provide a method for heteroepitaxial growth of the above defined two-dimensional material on a single crystal surface of the above defined three-dimensional material, and the following two steps are essential in the method.

(i) A first or pretreating step in which free bonds are removed from that crystal surface of a substrate formed of the three-dimensional material which surface has an axis for 6-fold or 3-fold symmetry, such as (111) surface of the crystal of cubic symmetry and (0001) surface of the crystal of hexagonal symmetry. The removal of free bonds is carried out by bonding such atoms to severed couplers (dangling bonds) on the above-mentioned surface, which atoms are not separable at the temperature of ensuing heteroepitaxial growth.

(ii) A second step in which the two-dimensional material is vacuum evaporated on the free-bond-removed surface of the substrate, so as to cause heteroepitaxial growth of a superthin film of the two-dimensional material while orienting atoms thereof in the direction of the crystalline axis of the substrate.

With the above two steps, the method of the invention facilitates satisfactory heteroepitaxial growth of the two-dimensional material on the three-dimensional material even when lattice matching conditions which are critical in regular crystal growth are not fulfilled.

To carry out the first step, the following practical measures may be taken.

(a) To use such crystal surface on which dangling bonds are terminated from the beginning; for instance, cleavage surface (111) of $CaF_2$ vacuum-heated surface.

(b) To use such crystal surface on which dangling bonds are orderly terminated by foreign atoms and the termination is stable up to a high temperature; for instance, sulphide-treated surface of GaAs whereon dangling bonds are orderly terminated by S atoms.

(c) To effect hetero growth of that substance on the substrate whose crystal surface can be treated by the termination of the preceding paragraph (a) or (b); for instance, to cause hetero growth of $CaF_2$ on the (111) surface of Si and then use the thus grown $CaF_2$.

The above-mentioned second step can be carried out by suitable superthin film growth techniques, such as the molecular beam epitaxy, the organometallic gas phase growth, and the like.

The art of growing a superthin single crystal film of one material on the surface of a single crystal of another material is a very important technique for facilitating the realization of those new electronic elements which use the heterojunction as a key factor, such as quantum well type semiconducting lasers, high-electron-mobility transistors, heterobipolar transistors, resonant tunnel elements, super-lattice elements, and the like. Most of conventional heteroepitaxial growth, such as that used in the above listed examples of the new electronic elements, relates to growth of a semiconducting material on another semiconducting material. It has been rather rare to use the heteroepitaxial growth of a metal, such as a superconductive metal, or an insulator on a semiconducting material. The reason for it is in that, generally speaking, clean surfaces of most solid three-dimensional materials have dangling bonds 1 as shown in FIG. 8, and when one material grows on another material, not all of such dangling bonds are coupled unless crystal structures and lattice constants thereof are matched, and the growing material cannot result in a single crystal. Thus, it has been believed that heteroepitaxial growth can be successful only between limited combinations of materials whose crystal structures are similar to each other and whose lattice conditions are matched.

Difference is coefficients of thermal expansion between the substrate and the material heteroepitaxially grown thereon can be a cause of stress therebetween as pointed out above.

Referring to FIG. 1, the method according to the invention comprises a first step of terminating the dangling bonds 1 of a substrate 2 made of three-dimensional material by coupling atoms of a desired substance thereto through a suitable means, and a second step of causing heteroepitaxial growth of a two-dimensional material 3 thereon by utilizing van der Vaars' force. Thereby, the inventors have succeeded in removing conventional restrictions on heteroepitaxial growth, such as lattice matching conditions, so as to produce novel heterojunctions and to expand the freedom in application of the heterojunctions.

BRIEF DESCRIPTION OF THE DRAWING

For a better understanding of the invention, reference is made to the accompanying drawings, in which:

FIG. 1 is an explanatory diagram of the heteroepitaxial growth according to the present invention;

FIG. 2 is a schematic block diagram of an apparatus for carrying out the method for heteroepitaxial growth according to the present invention;

Figure 5:
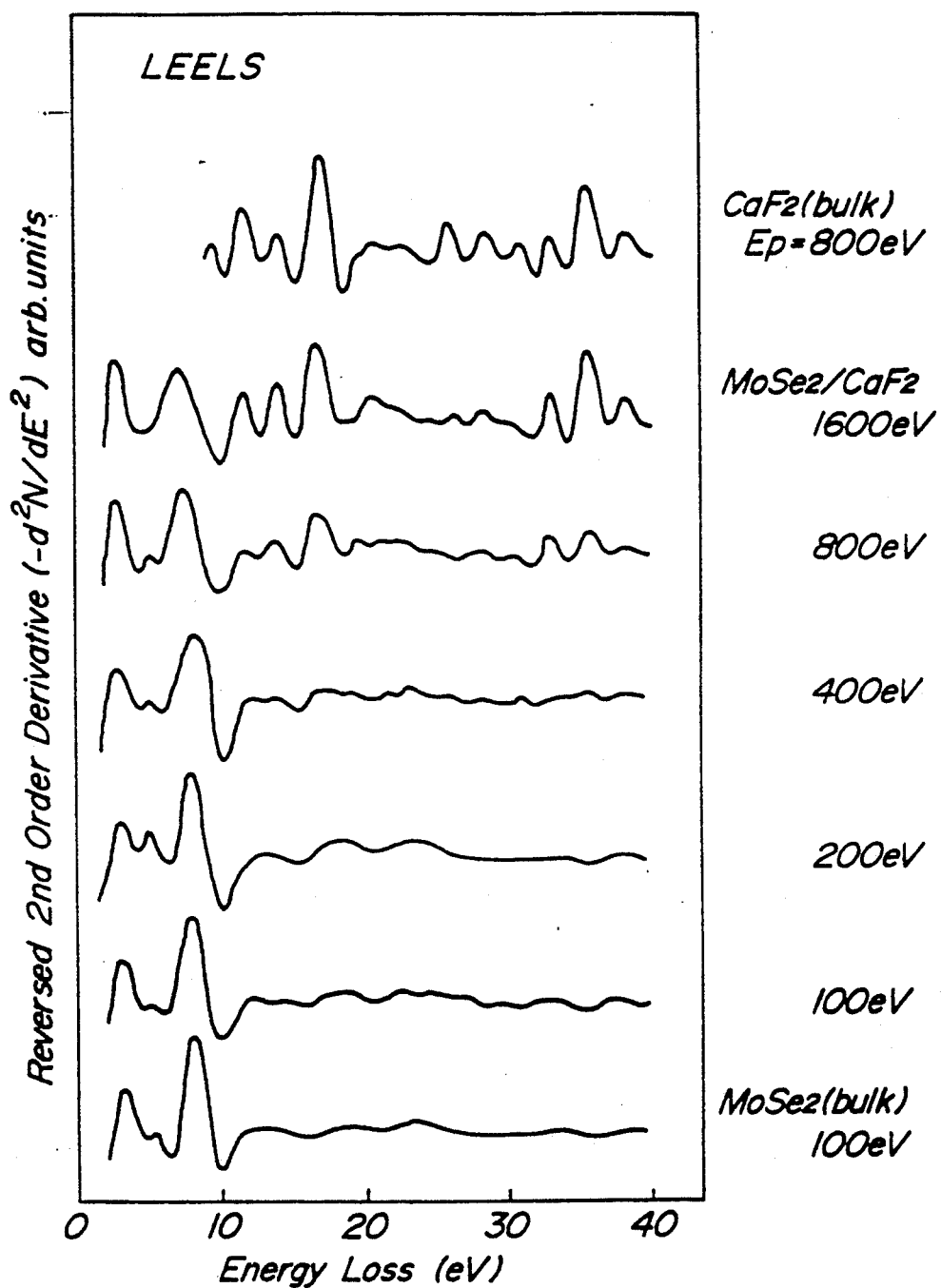
Figure 6:
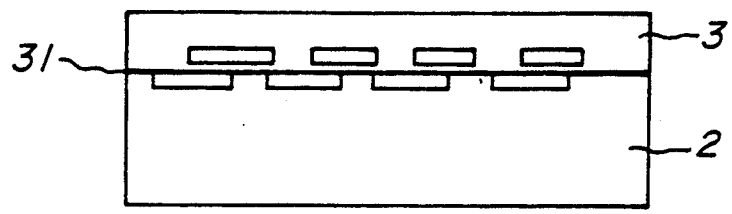
Figure 7:
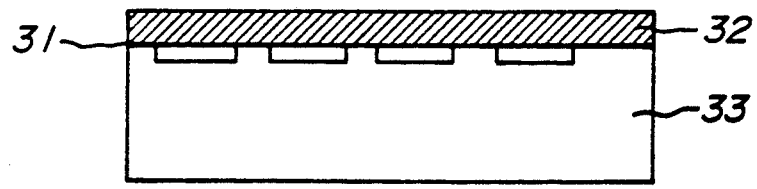
Figure 8:
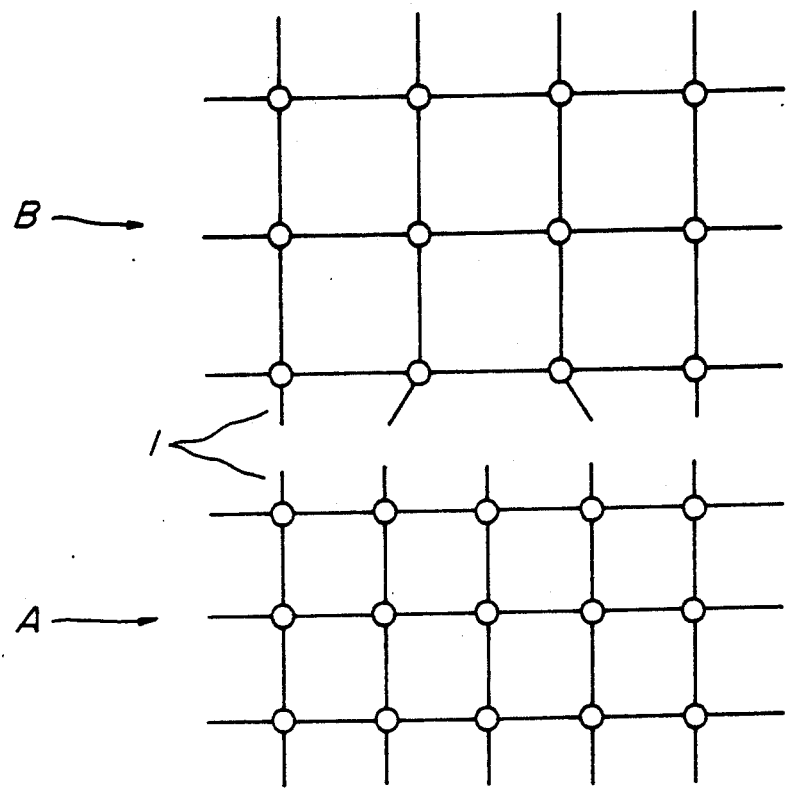

Photographic pictures (a) and (b) of FIG. 3 show RHEED patterns representing crystalline structures of $CaF_2$ substrate and $MoSe_2$ film produced thereon through heteroepitaxial growth, respectively;

FIG. 4 shows curves of Auger electron spectra taken on specimens prepared by the method of the invention;

FIG. 5 shows curves of low-energy electron loss spectra taken on specimens prepared by the method of the invention;

FIG. 6 and FIG. 7 illustrate examples of electronic devices to be produced by the method of the invention, respectively; and FIG. 8 is a schematic diagram showing dangling bonds of three-dimensional materials.

Throughout different views of the drawings, 1 is a dangling bond, 2 is a substrate of three-dimensional material, 3 is a film of two-dimensional material, 4 is a metal evaporation means with liquid nitrogen shroud, 5 is an Se source for evaporation, 6 is an Mo source for evaporation, 7 and 8 are shutters, 9 is a specimen, 10 is a specimen-holding mechanism, 11 is cylindrical-mirror type electron-energy analyzer, 12 is an electron gun, 13 is a cylindrical-mirror electrode, 14 is an electron multiplier tube, 15 is an output terminal, 16 is a RHEED electron gun, 17 is a RHEED screen, 18 is a film-thickness monitor, 19 is an oil diffusion pump, 20 is an oil rotary pump, 21 is a titanium sublimation pump, 22 is an inlet opening of vacuum pump, 23 is a vacuum housing, 31 is a boundary surface, 32 is an integrated element, 33 is a protective film, and A and B are three-dimensional materials.

DESCRIPTION OF THE PREFERRED EMBODIMENT

The invention will be described in further detail by referring to two experiments.

EXPERIMENT 1

In the first experiment, a hetero grown $MoSe_2$ film was produced on the (111) surface of a three-dimensional substrate 2 consisting of $CaF_2$. Immediately after being cleaved, the substrate 2 was brought into a molecular-beam epitaxy apparatus to carry out epitaxial growth of $MoSe_2$ thereon under the conditions of substrate temperature of about 400° C. and growth rate of about 0.1 Å/sec.

FIG. 2 shows the molecular-beam epitaxy apparatus used, in which a metal evaporation means 4 had an Se source 5 for evaporation and an Mo source 6 for evaporation. A resistive heating furnace, such as the Knudsen cell with tantalum wires, was used for the Se source 5. The Mo source 6 was an electron beam evaporation source, and an electron beam was irradiated on metal surface through an electrostatic lens at the periphery of a furnace, and the metal was locally heated up to 3,000° C. so as to cause evaporation of the metal by heating with the electron beam. The evaporated metal was focused on a specimen 9. Shutters 7 and 8 were provided to cut off the metal evaporation selectively. The specimen 9 was held by a specimen-holding mechanism 10.

The Se source 5, the Mo source 6 and the specimen 9 were placed in a vacuum housing 23 which was evacuated by a combination of a main pump consisting of an oil diffusion pump 19 with a liquid nitrogen trap driven by an oil rotary pump 20, a titanium sublimation pump 21, and an auxiliary vacuum pump with an inlet opening 22. The vacuum housing 23 was evacuated to $10^{-5}$ torr by the auxiliary vacuum pump with the inlet opening 22, and then further evacuated to $10^{-10}$ torr by the main pump.

The inventors expected that the epitaxial growth of $MoSe_2$ could occur on a (111) surface of the $CaF_2$ substrate in a temperature range of 400°-600° C. With the inside of the vacuum housing 23 kept at the above-mentioned temperature range, Se and Mo were evaporated on the substrate in the evacuated atmosphere at the temperature of the above range, and a single crystal superthin film of $MoSe_2$ was grown heteroepitaxially on the substrate surface.

A RHEED electron gun 16 generated and emanated an electron beam toward that substrate surface with a small incident angle on which surface the superthin film was grown. Reflection pattern from the substrate surface in response to the incident electron beam was projected on a RHEED screen 17 and monitored thereby. After the monitoring of the reflection pattern was finished, a movable arm 10A of the specimen-holding mechanism 10 carrying the specimen 9 was turned by 90°, so as to let the specimen 9 to face a cylindrical-mirror type electron energy analyzer 11. An electron gun 12 of the analyzer 11 irradiated the surface of the specimen 9 with an electron beam, so as to produce secondary electrons from the specimen surface. The analyzer 11 also had a cylindrical mirror electrode 13 which collected the above secondary electrons and converged them, and an electron multiplier tube 14 of the analyzer 11 received the converged electrons and delivered the multiplied output to an output terminal 15. In the multiplier tube 14, one input electron was multiplied up to about one million electrons, so as to facilitate analysis by such multiplication.

A quartz oscillation type film thickness monitor 18 was placed at a position close to where the specimen 9 was held during the vacuum evaporation. The thickness monitor 18 measured the thickness of the superthin film by using deposition of the evaporated metal particles thereon, which metal particles were representatives of those to form the superthin film.

With the apparatus of FIG. 2, an Mo beam produced from the Mo source 6 and an Se beam thermally produced from the Knudsen cell of the Se source 5 were focused on the (111) surface of the $CaF_2$ substrate specimen. Photographs (a) of FIG. 3 show RHEED patterns or reflected high-speed electron beam diffraction patterns from the (111) surface of the substrate of the specimen 9 before the growth of the superthin film, and the photographs (b) of FIG. 3 show the corresponding patterns from the $MoSe_2$ superthin film formed on the substrate surface by the hetero growth. Streak patterns proved that the $MoSe_2$ film grew in the form of a single crystal. It was noted that interval of the streak patterns of the substrate and the hetero grown film were different by a ratio of about 1.2, and such interval difference proved that the $MoSe_2$ substrate whose lattice constant differed from that of the film by a ratio of about 1.2. When RHEED patterns of the substrate and the heterogrown film were taken from a different crystal angle, there was a close correspondence between them, and such close correspondence proved that their crystal axes were oriented substantially in the same direction with a difference of smaller than 1°.

To check whether the superthin film thus formed had the desired chemical composition or not, Auger electron spectrum of it was taken. The curve (b) of FIG. 4 shows the result. The curves (a) and (c) of FIG. 4 are Auger electron spectra of the $CaF_2$ substrate and an single crystal substrate of $2H-MoSe_2$, respectively. Since the curves (b) and (c) of FIG. 4 are substantially the same, it was proved that the superthin film consisted of single-crystal $MoSe_2$ as intended in the experiment.

Low-energy electron loss spectrum of the single crystal superthin film $MoSe_2$ (about 7 Å thick) grown on the (111) surface of the $CaF_2$ substrate was taken, while varying the incident electron energy so as to change the probing depth. FIG. 5 shows the result. The bottom curve of FIG. 5 represents the spectra of single crystal $MoSe_2$. The incident electron energy of 400 eV or less resulted in a probing depth of 6 Å or less, while the incident electron energy of higher than 800 eV resulted in a probing depth of deeper than 8 Å. As can be seen from FIG. 5, when the probing depth was less than 6 Å, the spectrum fully agreed with that of the single crystal $MoSe_2$. On the other hand, when the probing depth was more than 8 Å, the spectrum was affected by that of the substrate $CaF_2$. Hence, the film thus formed had a thickness of about 7 Å and yet it was proved to be a high quality continuous film of $MoSe_2$ produced on the $CaF_2$ substrate. Further, the spectra proved that the $CaF_2/MoSe_2$ interface produced by the method of the invention was very steep in terms of atomic level.

Thus, the result of Experiment 1 proved that, with the method of the invention, a superthin two-dimensional film of $MoSe_2$ could be produced on the specific surface of the three-dimensional $CaF_2$ substrate through heteroepitaxial growth.

Separately, the inventors have succeeded in an experiment of heteroepitaxial growth of a superthin film of superconductive metal $NbSe_2$ on the (111) surface of the three-dimensional $CaF_2$ substrate. In this case, suitable temperature and growth rate for the heteroepitaxial growth were found to be about 400° C. and 0.1 Å/sec, respectively.

EXPERIMENT 2

Tests were made on the heteroepitaxial growth of a superthin film on a GaAs substrate. The GaAs substrate had a (111) surface, and dangling bonds of such surface were terminated with S atoms. The inventors have succeeded in the heteroepitaxial growth of each of $MoSe_2$ and $NbSe_2$ superthin films of the dangling-bond-free surface of the GaAs substrate through the same process as that of the preceding Experiment 1.

In particular, to terminate the dangling bonds with S atoms, the (111) surface of a GaAs wafer was mechanically ground, etched by a 5% methanol solution of Br, dipped in a $(NH_4)_2S$ solution for more than one hour, and then heated at 400° C. in an ultra-high vacuum for several minutes. The surface of the GaAs substrate thus treated had a single-atom film of S deposited thereon in such a manner that the dangling bonds consisting of Ga on the surface of GaAs were terminated by the S atoms. Such termination of the dangling bonds with S atoms was confirmed by Auger electron spectroscopy and low-energy electron loss spectroscopy. With the surface thus treated, heteroepitaxial growth proceeded with van der Vaars' force alone, so as to facilitate hetero-epitaxial growth of a superthin film. The S atoms on the surface of the GaAs substrate were stable up to about 550° C. in an ultra-high vacuum, and with the temperature for heteroepitaxial growth kept below 550° C., the heteroepitaxial growth with van de Vaars' force was not affected by the dangling bonds.

Examples of important applications of the method according to the invention are as follow.

I. Heteroepitaxial growth of a single crystal superconductive film on a semiconducting substrate Silicon, a IV group element, is one of the most important semiconducting materials for integrated circuit devices of both digital and analog type. If a superconductive film can be heteroepitaxially grown on silicon substrate, it will open a new field of integrated circuits which include superconductive elements, e.g., Josephson junction devices and superconducting quantum interference devices (SQUID), as integral parts thereof. Heretofore, it has been impossible to grow any high quality heteroepitaxial film of superconductive material on a semiconducting substrate due to lattice matching conditions and the like.

The invention facilitates the formation of a heteroepitaxial superconductive film on a semi-conducting substrate. More specifically, the method of the invention can be used to form a heteroepitaxially grown film of $CaF_2$ of single atom thickness or thicker, and also to form a heteroepitaxially grown film of superconductive material such as $NbSe_2$ or $NbS_2$ on the $CaF_2$ film. A single crystal film of various layered materials can be freely formed on the layered $NbSe_2$ or $NbS_2$ through heteroepitaxial growth; for instance, a layered insulating material such as $HfSe_2$ can be grown thereon and a further layered superconductive material such as $NbSe_2$ or $NbS_2$ can be grown on the insulating material, so as to produce a superconductive element like a high quality Josephson junction device or a SQUID element. In short, a superconductive element can be formed on a silicon substrate or can be integrated as a portion of a larger integrated circuit element.

FIG. 6 shows an example of such superconductive element. Dangling bonds on a boundary surface 31 of a three-dimensional substrate 2 are terminated in the above-mentioned manner, and a superconductive element is formed thereon by forming a layered film or layer 3 of superconductive material on the boundary surface 31.

The invention also enables, for the first time in the industry, heteroepitaxial growth of a superthin superconductive film on a semiconducting compound or mixed crystal that plays an important role in optoelectronics; for instance, III-V-compound or -mixed-crystal such as GaAs, $In_{1-x}Ga_xAs_{1-y}P_y$, and II-VI-compound or -mixed-crystal such as ZnSe.

More specifically, the method of the invention can be used to terminate the dangling bonds on the surface of a III-V-compound semiconducting substrate, such as a GaAs substrate, with S atoms and to produce a hetero grown superconductive film of $NbSe_2$, NbS and the like thereon. Further, it is also possible to form films of various materials on the thus produced superconductive film through heteroepitaxial growth, so as to produce a superconductive element like a high quality Josephson junction device or a SQUID element. In short, a superconductive element can be integrated as a portion of an optoelectronic integrated circuit element.

II. Formation of a protective film on semiconducting devices

It is known that cleavage surface of a layered material is free from dangling bonds, and such cleavage surface has a much smaller coefficient of gas molecule absorption as compared with surfaces other substances. Hence, it may be used as an excellent protective film. To this end, one must form a thin film of the layered material, which thin film has a cleavage surface. A thin film produced by the method of the invention through heteroepitaxial growth on a semiconducting substrate has a cleavage surface. Thus, the invention can be used for production of a protective film.

For instance, a protective film can be formed on a silicon element or a GaAs element by the method of the invention through the heteroepitaxial growth of a thin film of layered material such as $MoSe_2$ or $MoS_2$.

FIG. 7 illustrates an example of such protective film. Boundary surface 31 of a silicon integrated circuit or an optoelectronic integrated circuit 32 has dangling bonds thereon terminated, and a protective film 33 is formed thereon by using a suitable layered material.

Although the invention has been described with a certain degree of particularity, it is understood that the present disclosure has been made only by way of example and that numerous changes in details of construction and parts may be resorted to without departing from the scope of the invention as hereinafter claimed.

What is claimed is:

1. A method for heteroepitaxial growth of a two-dimensional material on a three-dimensional substrate material, comprising a first step of eliminating free bonds from a crystal surface of a three-dimensional substrate by terminating dangling bonds on the crystal surface by coupling foreign atoms to the dangling bonds, said atoms being inseparable at temperatures for ensuing heteroepitaxial growth, the crystal surface having a 6-fold or 3-fold symmetry of (111) plane of a crystal of cubic symmetry or (0001) plane of a crystal of hexagonal symmetry, and a second step of evaporating a two-dimensional material as a superthin layer on the free-bond-eliminated crystal surface of the substrate so as to cause heteroepitaxial growth while orienting atoms of the two-dimensional material in a direction of crystalline axis of the substrate by van der Waals' force.

2. A method for heteroepitaxial growth of a two-dimensional superconductive material on a three-dimensional semiconductor substrate, comprising a first step of eliminating free bonds from a crystal surface of a three-dimensional semiconductor substrate by terminating bonds on the crystal surface with foreign atoms coupled thereto, said foreign atoms being inseparable at temperatures for ensuing heteroepitaxial growth, the crystal surface having a 6-fold or 3-fold symmetry, and a second step of evaporating a two-dimensional superconductive material as a superthin on the free-bond-eliminated crystal surface of the substrate so as to cause heteroepitaxial growth while orienting atoms of the superconductive material in a direction of crystalline axis of the substrate by van der Waals' force.

3. A method as set forth in claims 1 or 2, wherein the crystal surface of the three-dimensional substrate is (111) cleavage plane of $CaF_2$ which plane has terminated dangling bonds.

4. A method as set forth in claims 1 or 2, wherein the crystal surface of the three-dimensional substrate is heated in vacuo so the crystal surface has terminated dangling bonds.

5. A method as set forth in claims 1 or 2, wherein the crystal surface of the three-dimensional substrate is a sulfide treated surface of GaAs which surface has dangling bonds that are orderly terminated with S atoms, the terminated dangling bonds being stable at high temperatures for ensuing heteroepitaxial growth.

6. A method as set forth in claims 1 or 2, wherein the crystal surface of the three-dimensional substrate has dangling bonds that are orderly terminated with impurity atoms, the terminated dangling bonds being stable at high temperatures for ensuring heteroepitaxial growth.

7. A method as set forth in claim 1 or 2, wherein the two-dimensional material is selected from the group consisting of transition metal dichalcogenide of $NbSe_2$, $NbS_2$, $MoS_2$, $MoSe_2$, $HfSe_2$, $NbS_{2-x}Se_x$ and mixed crystal thereof; graphite; layered material of GaS, GaSe, $GaS_{1-x}Se_x$ and the mixed crystal thereof; mica of $K_2Al_4$ $(Si_6Al_2O_{28})$ $(OH, F)_4$, $Mg_6$ $(Si_8O_{28})$ $(OH)_4$ and the mixed crystal thereof.

8. A method as set forth in claim 1 or 2, wherein a three-dimensional substrate material is selected from the group consisting of semiconducting material of group IV and their mixed crystal; diamond; semiconducting material of III-V group compound and the mixed crystal; semiconducting material of II-VI group compound and the mixed crystal thereof; alkali halides and the mixed crystal thereof; alkaline earth halides and the mixed crystals thereof; silver halides and the mixed crystal thereof; chalcopyrite type crystalline materials and the mixed crystal thereof.

9. A method as set forth in claim 1 or 2, wherein a three-dimensional substrate material is selected from the group consisting of Si, Ge, $Si_{1-x}Ge_x$, diamond, GaAs, InP, $Ga_{1-x}Al_xAs$, $InAs_{1-x}P_x$, $In_{1-x}Ga_xAs_{1-y}P_y$, ZnSe, CdS, HgTe, $Hg_{1-x}Cd_xTe$, $ZnS_{1-x}Se_x$, NaCl, KBr, $Na_{1-x}K_xCl$, $NaCl_{1-x}Br_x$, $CaF_2$, $SrF_2$, $BaF_2$, $Ca_{1-x}Sr_xF_2$, AgCl, AgBr, $AgCl_{1-x}Br_x$ and $CuFeS_2$.

10. A method for heteroepitaxial growth of a two-dimensional superconductive material on a three-dimensional semiconductor substrate, comprising steps the of heteroepitaxially growing $CaF_2$ on (111) crystal surface of a three-dimensional semiconductor silicon (Si) substrate, and evaporating a two-dimensional superconductor material as a superthin layer on the free-bond-eliminated crystal surface of the substrate so as to cause heteroepitaxial growth while orienting atoms of the superconductive material in a direction of crystalline axis of the substrate by van der Vaars' force.

* * * * *